United States Patent
Lenz et al.

[19]

[11] Patent Number: 5,905,454
[45] Date of Patent: May 18, 1999

[54] DIGITAL-TO-ANALOG CONVERTER WITH COMPLEMENTARY OUTPUTS

[75] Inventors: Kuno Lenz, Meylan, France; Welk Reiner, Saint Ismier, France

[73] Assignee: SGS-Thomson Microelectronics S.A., Saint Genis, France

[21] Appl. No.: 08/993,364

[22] Filed: Dec. 18, 1997

[30] Foreign Application Priority Data

Dec. 19, 1996 [FR] France ................................... 96/16000

[51] Int. Cl.⁶ .................................................. H03M 1/66
[52] U.S. Cl. .......................................... 341/144; 341/154
[58] Field of Search ..................................... 341/144, 154

[56] References Cited

U.S. PATENT DOCUMENTS

| | | | |
|---|---|---|---|
| 4,056,740 | 11/1977 | Schoeff | 307/362 |
| 4,292,625 | 9/1981 | Schoeff | 340/347 |
| 4,410,880 | 10/1983 | Zaborowski | 340/347 |
| 4,774,497 | 9/1988 | Taylor | 341/118 |
| 5,525,986 | 6/1996 | Kovacs et al. | 341/136 |

*Primary Examiner*—Michael J. Tokar
*Assistant Examiner*—Anh Q. Tran
*Attorney, Agent, or Firm*—Wolf, Greenfield & Sacks, P.C.

[57] ABSTRACT

The present invention relates to a digital-to-analog converter providing two complementary output signals varying inversely with respect to each other and by steps according to a digital datum to be converted, including circuitry for offsetting by one step the variation characteristic of one of the output signals.

30 Claims, 2 Drawing Sheets

DIGITAL-TO-ANALOG CONVERTER WITH COMPLEMENTARY OUTPUTS

BACKGROUND OF THE INVENTION

1. Field of the Invention

The present invention relates to digital-to-analog converters providing two complementary outputs, and more specifically, to a digital-to-analog converter of R-2R type.

2. Discussion of the Related Art

FIG. 1 schematically shows a conventional digital-to-analog converter of R-2R type. In this type of converter, currents I/2, I/4, I/8 . . . stepped according to a geometric series of ratio ½ are generated. The series of currents includes as many currents as there are bits in a digital datum D to be converted (4 in the example of FIG. 1). Each of these currents is directed by a respective switch K to one or the other of two complementary outputs Io, Io* according to a respective bit of datum D. The currents of the series are provided by a network of resistors 10 of R-2R type. A current source 12 draws a current I of network 10 to a low supply potential Vee.

The first current I/2 of the series is provided by a resistor of value 2R connected to current source 12. The second current I/4 of the series is provided by two resistors of values R and 2R connected in series to current source 12. Each of the following currents of the series is provided by two resistors of values R and 2R connected in series to the connection node of the two resistors providing the preceding current.

The last current of the series is provided by a single resistor 13 of value 2R. This last resistor 13 provides a current equal to the penultimate current of the series (I/8 in the example), and must thus be divided by 2 to effectively provide the last current I/16 of the series. In the example shown in FIG. 1, resistor 13 is connected to the emitters of both cascode transistors Q1 and Q1' of identical characteristics, in which the current I/8 provided by resistor 13 is distributed. The bases of transistors Q1 and Q1' are biased by a same voltage Vb1. The last current I/16 of the series is taken from the collector of transistor Q1 while the collector of transistor Q1' is connected to a high supply potential Vcc. To ensure that network 10 and current source 12 operate in proper conditions, switches K are connected to the corresponding resistors of network 10 via respective cascode transistors Q2, the last transistor Q2 being connected between network 10 and cascode transistors Q1 and Q1'. The bases of transistors Q2 are biased by a same voltage Vb2, the collectors are connected to the respective switches K, and the emitters are connected to the corresponding resistors of network 10. The emitter surface areas of transistors Q2 are preferably chosen to be proportional to the currents flowing in these transistors.

With such a converter, each of outputs Io and Io* can take $2^n$ discrete values, corresponding to the possible combinations of the n bits of datum D. In the example, n=4 and the amplitude of the steps is I/16. Outputs Io and Io* vary in inverse directions with respect to each other.

In some applications, it is desired to generate an analog bipolar signal, that is, a signal which varies between a positive and a negative value, based on digital datum D. This is, for example, the case for a circuit the offset voltage of an amplifier.

By means of a converter of the type of FIG. 1, a bipolar current can be generated. Such a current is obtained by forming the difference Io–Io* of the complementary output currents of the converter.

As shown as an example in FIG. 1, current Io-Io* can be obtained by means of a current mirror 14, the input of which receives current Io. The complementary current Io* is taken from the output of current mirror 14 and the residual current on this output forms the desired current Io–Io*.

Current mirror 14 includes, for example, two PNP transistors Q3 and Q4, the emitters of which are connected to high supply potential Vcc, and the bases of which are interconnected. The collector of transistor Q3 is connected to the base of transistors Q3 and Q4 and receives current Io. The collector of transistor Q4 receives current Io* and supplies current Io–Io*.

FIG. 2 illustrates the variation of signal Io–Io* according to the successive values of datum D. In the example of FIG. 1, datum D varies from 0 to 15. Current Io–Io* varies from –15I/16 to +15I/16 by steps of 2I/16. For example, when datum D is equal to 6 (decimal) or 0110 (binary), the switches K associated with currents I/2 and I/16 are positioned towards output Io*, while the remaining switches K are positioned towards output Io. Thus, current Io* is I/2+I/16=9I/16, while current Io is I/4+I/8=6I/16, whereby current Io-Io* is equal to –3I/16.

There appears to be no value of D for which current Io–Io* is zero. This is a disadvantage in some applications. For example, if such a converter is used to perform an offset setting, a zero offset cannot be obtained.

SUMMARY OF THE INVENTION

An object of the present invention is to provide a digital-to-analog converter which enables generation of a bipolar signal which can have a zero value.

This and other objects is achieved by means of a digital-to-analog converter providing two complementary output signals varying inversely with respect to each other and by steps according to a digital datum to be converted, including means for offsetting by one step the variation characteristic of one of the output signals.

According to an embodiment of the present invention, currents stepped according to a geometric series of ratio ½ are individually directed towards one or the other of two complementary outputs according to the value of the digital datum. A compensation current, equal to the lowest current of the series, is superposed to the current of one of the two complementary outputs.

According to an embodiment of the present invention, the complementary outputs and the compensation current are provided to respective terminals of an integrated circuit, so that the compensation current can be superposed to one of the output currents chosen by the user by an external link between the adequate terminals.

According to an embodiment of the present invention, the currents of the series are supplied from a network of resistors of R-2R type, the current provided by the last resistor of the network being divided by two cascode transistors having the same characteristics, one of which provides the lowest current of the series and the other one of which provides the compensation current.

According to an embodiment of the present invention, the converter includes means for producing the difference of the complementary output signals.

The foregoing objects, characteristics and advantages of the present invention will be discussed in detail in the following non-limiting description of specific embodiments, in connection with the accompanying drawings.

DETAILED DESCRIPTION

To obtain a bipolar analog signal which can have a zero value, the present invention provides to offset by one step, upwards or downwards, one of the two complementary signals provided by a digital-to-analog converter.

Figure 3:
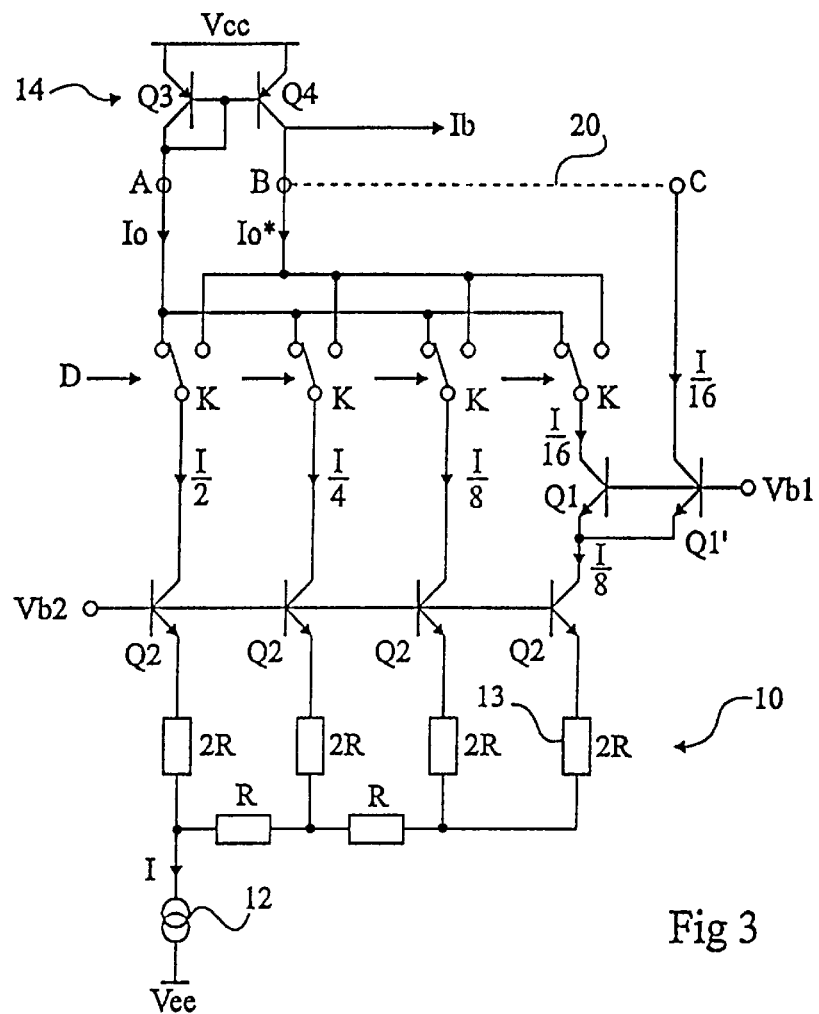
FIG. 3 shows an embodiment of digital-to-analog converter according to the present invention.

FIG. 3 shows an embodiment of digital-to-analog converter according to the present invention enabling implementation of this function in a particularly simple and accurate way. This converter is based on the converter of FIG. 1 and accordingly includes same elements designated with same reference characters.

Figure 1:
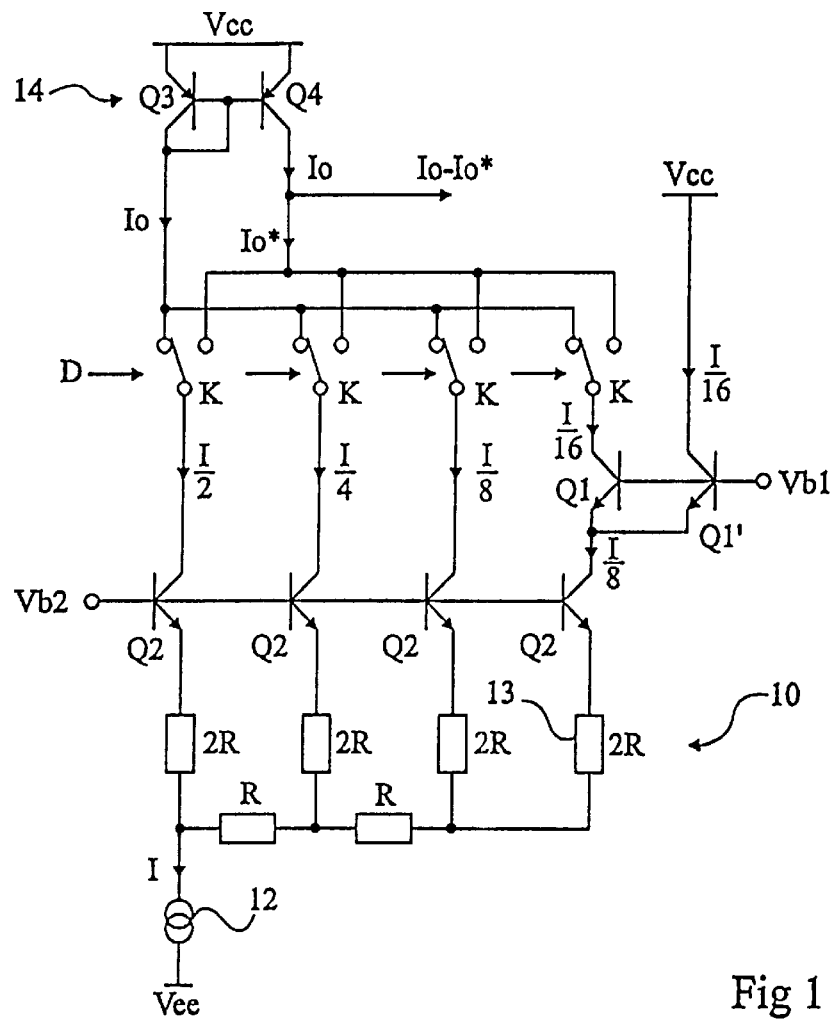
FIG. 1, previously described, shows a conventional digital-to-analog converter with complementary outputs.

According to the present invention, the collector of transistor Q1', which was connected to high supply potential Vcc in FIG. 1, is here connected to one of complementary outputs Io and Io*. For example, as shown by a dotted link 20, the collector of this transistor Q1' is connected to output Io*. Thus, current Io* is increased by a constant value, I/16 in FIG. 3, equal to the value of the last current of the series of switched currents. This link does not disturb the normal establishment, by means of switches K, of currents Io and Io*.

Figure 2:
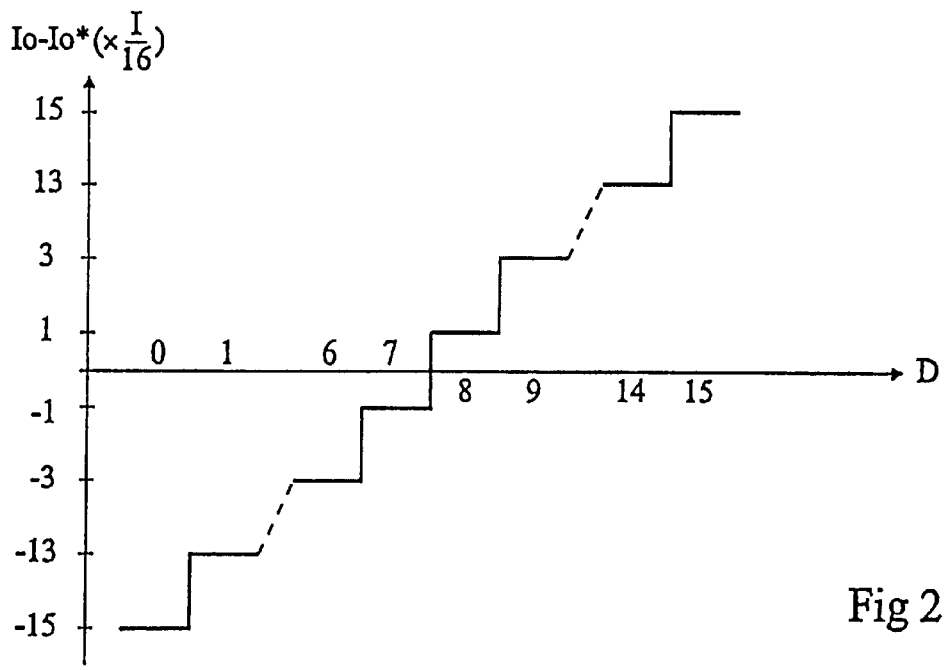
FIG. 2, previously described, shows a characteristic of variation of a bipolar signal generated from the converter of FIG. 1.
Figure 4:
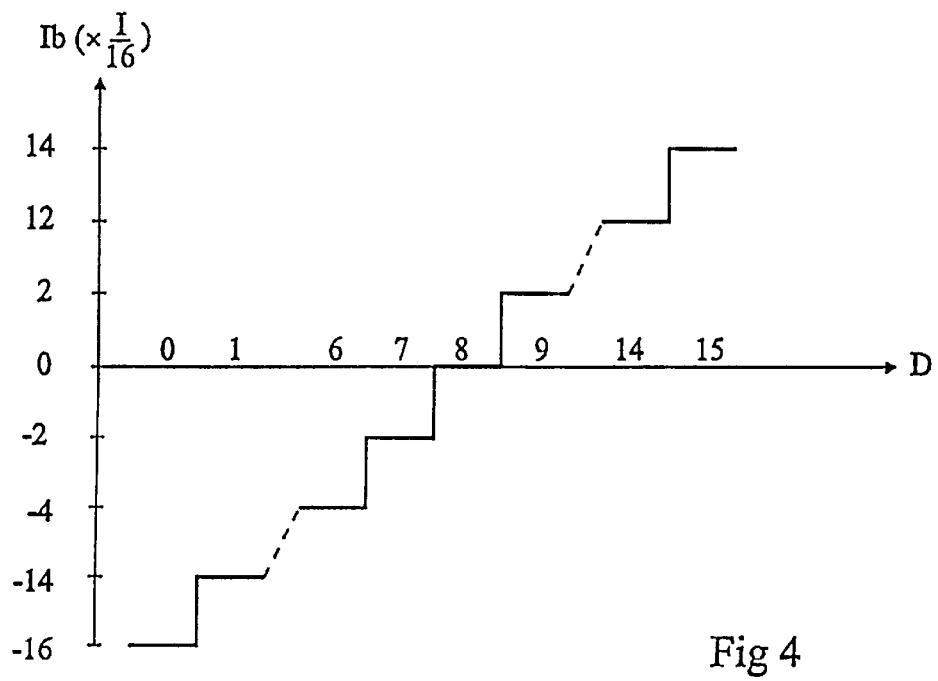
FIG. 4 shows a characteristic of variation of a bipolar signal generated from the converter of FIG. 3.

FIG. 4 illustrates the resulting variation of bipolar output signal Ib taken from the collector of transistor Q4. The variation characteristic of current Ib is offset downwards by I/16, that is, by half a step, with respect to the variation characteristic of current Io-Io* of FIG. 2. As a result, current Ib is zero for value 8 of datum D. Further, this current Ib varies between –I and +14I/16 by steps of 2I/16 when digital value D varies from 0 to 15.

If the collector of transistor Q1' is connected to output Io, the characteristic is shifted upwards by half a step, and signal Ib is zero for value 7 of digital datum D.

The variation range of bipolar signal Ib is not symmetrical with respect to value 0. This generally has no importance, since this signal is used in the vicinity of its zero value in most applications.

According to an embodiment of the present invention, the integrated circuit in which the converter of FIG. 3 is incorporated includes terminals A and B on which complementary currents Io and Io* are available, and a terminal C connected to the collector of transistor Q1'. Link 20 is not implemented inside the integrated circuit. On the contrary, the user is left free to implement this link externally between terminal C and one of terminals A and B, or else high potential Vcc, according to whether the user desires an upward or downward offset of the characteristic of current Ib, or desires no offset, that is, a conventional operation. This enables implementation of a single circuit satisfying all applications.

Of course, the present invention is likely to have various alterations, modifications, and improvements which will readily occur to those skilled in the art. The present invention has been described as an example by means of a converter of R-2R type which enables obtaining a particularly accurate result. However, those skilled in the art will know how to apply the present invention to other types of converters.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A digital-to-analog converter providing two complementary output signals that vary inversely with respect to each other and by steps according to a digital datum to be converted, including means for offsetting by one step a variation characteristic of one of the output signals, wherein currents stepped according to a geometric series of ratio ½ are individually directed towards one or the other of two complementary outputs according to the value of the digital datum, a compensation current, equal to the lowest current of the series, is superposed to the current of one of the two complementary outputs, and the complementary outputs and the compensation current are provided to respective terminals of an integrated circuit, so that the compensation current can be superposed to one of the output currents chosen by the user by an external link between the adequate terminals.

2. The digital-to-analog converter of claim 1, wherein the currents of the series are supplied from a network of resistors of R-2R type, the current provided by the last resistor of the network being divided by two cascode transistors having the same characteristics, one of which provides the lowest current of the series and the other one of which provides the compensation current.

3. The digital-to-analog converter of claim 1, wherein the converter includes means for producing a difference of the complementary output signals.

4. The digital-to-analog converter of claim 2, wherein said two cascade transistors have their bases interconnected.

5. The digital-to-analog converter of claim 4, wherein the bases of the two cascode transistors are connected to a supply voltage.

6. The digital-to-analog converter of claim 5, wherein said network also includes a plurality of cascode transistors, one associated with and in series with each resistor.

7. The digital-to-analog converter of claim 6, wherein the emitters of the two cascode transistors are interconnected.

8. The digital-to-analog converter of claim 7, wherein the emitters of the two cascode transistors are coupled to the one of the plurality of cascode transistors having the smallest current.

9. The digital-to-analog converter of claim 8, wherein the collector of one of the two cascode transistors issues the lowest current of the series and the collector of the other one of the two cascode transistors provides the compensation current.

10. The digital-to-analog converter of claim 3, wherein the means for producing the difference includes a current mirror means.

11. The digital-to-analog converter of claim 10, wherein said current mirror means includes a pair of transistors.

12. The digital-to-analog converter of claim 11, wherein the bases of the transistor means are interconnected.

13. The digital-to-analog converter of claim 12, wherein the emitters of the transistor means are both coupled to a supply voltage.

14. The digital-to-analog converter of claim 2, wherein said network also includes a series of switches connected to the corresponding resistors.

15. The digital-to-analog converter of claim 14 wherein said network also includes a plurality of cascode transistors, each coupled between a switch and a resistor.

16. In a digital-to-analog converter that provides output signals that vary inversely with respect to each other and by steps according to a digital datum to be converted, an output circuit that enables generation of a bipolar signal which can have a zero value, comprising, a link, and a circuit for connecting the link to provide a compensation current, wherein currents stepped according to a geometric series of ratio I/2 are individually directed toward one or the other of two complementary outputs according to the value of the digital datum, said compensation current being superposed to the one of the two complementary outputs by said link.

17. The digital-to-analog converter of claim 16, wherein said link provides an offset by one step.

18. The digital-to-analog converter of claim 17, wherein said compensation current is the lowest current of the series.

19. The digital-to-analog converter of claim 18, wherein the complementary outputs and the compensation current are provided to respective terminals of an integrated circuit.

20. The digital-to-analog converter of claim 19, wherein the currents of the series are supplied from a network of resistors of R-2R type, the current provided by the last resistor of the network being divided by two cascode transistors having the same characteristics, one of which provides the lowest current of the series and the other one of which provides the compensation current.

21. The digital-to-analog converter of claim 19, wherein the converter includes means for producing a difference of the complementary output signals.

22. In a digital-to-analog converter that provides output signals that vary inversely with respect to each other and by steps according to a digital datum to be converted, a means for offsetting by one step a variation characteristic of one of the output signals, wherein currents stepped according to a geometric series of ratio I/2 are individually directed toward one or the other of two complementary outputs according to the value of the digital datum, a compensation current, equal to the lowest current of the series, being superposed to the current of one of the two complementary outputs, and complementary outputs and an the compensation current being provided to respective terminals of an integrated circuit, so that the compensation current can be superposed to one of the output currents chosen by the user.

23. The digital-to-analog converter of claim 22, wherein said means for offsetting includes link means.

24. The digital-to-analog converter of claim 23, wherein the currents of the series are supplied from a network of resistor means of R-2R types.

25. The digital-to-analog converter of claim 24 further comprising two cascode transistor means having the same characteristics, the current provided by the last resistor means on the network being divided by said two cascode transistor means.

26. The digital-to-analog converter of claim 25, wherein one of said cascode transistor means provides the lowest current of the series and the other one provides the compensation current.

27. The digital-to-analog converter of claim 22, wherein the converter includes means for producing a difference of complementary output signals.

28. A method of digital-to-analog conversion to provide output signals that vary inversely with respect to each other and by steps according to a digital datum to be converted, said method including offsetting by one step a variation characteristic of one of the output signals, wherein currents stepped according to a geometric series of ratio I/2 are individually directed toward one or the other of two complementary outputs according to the value of the digital datum, providing a compensation current, equal to the lowest current of the series, and superposing the compensation current to the current of one of the two complementary outputs.

29. The method of claim 28, wherein the complementary outputs in the compensation current are provided to respective terminals of an integrated circuit, so that the compensation current can be superposed to one of the output currents chosen by the user.

30. A method for digital-to-analog conversion that provides output signals that vary inversely with respect to each other and by steps according to a digital datum to be converted, said method including providing a link, connecting the link to provide a compensation current, wherein currents stepped according to a geometric series of ratio I/2 are individually directed toward one or the other of two complementary outputs according to the value of the digital datum, and superposing the compensation current to one of two complementary outputs.

* * * * *

UNITED STATES PATENT AND TRADEMARK OFFICE
CERTIFICATE OF CORRECTION

PATENT NO. : 5,905,454
DATED : May 18, 1999
INVENTOR(S): Kuno Lenz and Reiner Welk It is certified that error appears in the above-identified patent and that said Letters Patent is hereby corrected as shown below:

On the title page, item [75] should read:

[75] Inventors: Kuno Lenz, Meylan, France; Reiner Welk, Saint Ismier, France

Signed and Sealed this

Nineteenth Day of October, 1999

*Attest:*

*Attesting Officer*

Q. TODD DICKINSON

*Acting Commissioner of Patents and Trademarks*